United States Patent [19]

Hatakeyama et al.

[11] Patent Number: 5,795,700
[45] Date of Patent: Aug. 18, 1998

[54] METHOD FOR FORMING RESIST PATTERN WITH ENHANCED CONTRAST FILM

[75] Inventors: Jun Hatakeyama, Annaka; Mitsuo Umemura, Usui-gun; Toshinobu Ishihara; Satoshi Watanabe, both of Jouetsu, all of Japan

[73] Assignee: Shin-Etsu Chemical Co., Ltd., Tokyo, Japan

[21] Appl. No.: 604,369

[22] Filed: Feb. 21, 1996

Related U.S. Application Data

[63] Continuation of Ser. No. 388,899, Feb. 14, 1995, abandoned, which is a continuation of Ser. No. 144,477, Nov. 2, 1993, abandoned.

[30] Foreign Application Priority Data

Nov. 2, 1992 [JP] Japan .................. 4-317878

[51] Int. Cl.$^6$ .................. G03C 5/00
[52] U.S. Cl. .................. 430/325; 430/273.1; 430/326; 430/327; 430/330; 430/339
[58] Field of Search .................. 430/325, 273.1, 430/326, 327, 330, 339

[56] References Cited

U.S. PATENT DOCUMENTS

| | | | |
|---|---|---|---|
| 4,677,049 | 6/1987 | Griffing et al. | 430/339 |
| 4,885,232 | 12/1989 | Spak | 430/326 |
| 5,310,620 | 5/1994 | Watanabe et al. | 430/273.1 |

FOREIGN PATENT DOCUMENTS 62-215939  9/1987  Japan .

*Primary Examiner*—George F. Lesmes
*Assistant Examiner*—Laura Weiner

*Attorney, Agent, or Firm*—Millen, White, Zelano & Branigan, P.C.

[57] ABSTRACT

A resist pattern is formed on a substrate by forming a water-soluble resist film on the substrate, forming a contrast enhancing film on the resist film from a contrast enhancing composition comprising a specific arylnitrone compound of formula (1), pre-baking the resist film before or after formation of the contrast enhancing film, exposing the resist film to light through the contrast enhancing film, baking the films after exposure, removing the contrast enhancing film after the baking step, and developing the resist film. The process forms a resist pattern having a fully rectangular profile and an improved focus margin. The conventional apparatus can be utilized without substantial modification, achieving a cost reduction.

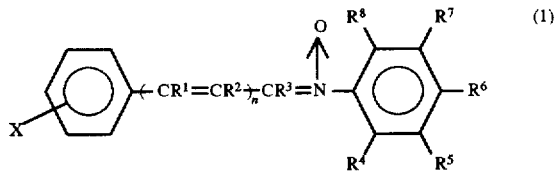

(1)

wherein $R^1$, $R^2$, and $R^3$ are independently an alkyl radical, an aryl radical or a hydrogen atom, $R^4$ to $R^8$ are independently an alkyl radical, a hydrogen atom or a carboxyl radical, at least one of $R^4$ to $R^8$ being a carboxyl radical, X is a hydrogen atom, an alkoxy radical represented by $R^9O—$, or a dialkylamino radical represented by $R^{10}R^{11}N—$ wherein $R^9$ is an alkyl radical, $R^{10}$ and $R^{11}$ are independently an alkyl radical, and letter n ha a value of 0, 1 or 2.

17 Claims, No Drawings

METHOD FOR FORMING RESIST PATTERN WITH ENHANCED CONTRAST FILM

This application is a continuation of application Ser. No. 08/388,899, filed Feb. 14, 1995, which is a continuation of application Ser. No. 08/144,477, filed Nov. 2, 1993, both now abandoned.

BACKGROUND OF THE INVENTION

1. Field of the Invention

This invention relates to a process for forming resist patterns on substrates such as silicon wafers by contrast enhancement lithography (CEL).

2. Prior Art

It is well known in the art that lithography is used in the fabrication of semiconductor integrated circuits. The lithographic process involves forming a photoresist film on a silicon wafer substrate to be etched and exposing the photoresist to light of predetermined wavelength through a mask with a processing pattern drawn thereon. In the case of a positive resist where a resist pattern is formed in the exposed region, the photoresist undergoes photochemical reaction with light transmitted by the mask to convert into a carboxyl-containing compound which is soluble in an alkaline developer. The photoresist is then developed by contacting it with an alkaline aqueous solution whereby the converted photoresist compound is dissolved away, forming a resist pattern corresponding to the mask pattern. The substrate is then etched through the resist pattern.

More particularly, the photo-lithographic process forms a patterned profile by spin coating a photoresist on a silicon wafer pretreated with hexamethyl disilazane (HMDS) to form an even film of a predetermined thickness. The coated silicon wafer is heated or pre baked, followed by patterning exposure through a photo mask, post-exposure baking (PEB), development with a developer solution, and rinsing with pure water.

The pre-baking step is to volatilize off the solvent from the photoresist film for improving the adhesion thereof to the substrate and minimizing a thinning of the film in unexposed regions. Exposure causes a so-called standing wave to generate within the photoresist since interference occurs between the incident light and the light reflected from the substrate. Thus the wall surface of the photoresist profile is waved after development. The post-exposure baking is effective for thermally diffusing the photosensitive agent in the exposed region, minimizing the waving of the resist profile wall surface, and providing the photoresist with a rectangular profile. There fore, the pre-baking and post-exposure baking steps are essential for the advanced photo lithographic process.

The lithographic process using photoresist is thus summarized as follows.

Process 1
(1) HMDS primer treatment of silicon wafer
(2) resist coating
(3) pre-baking
(4) exposure
(5) post-exposure baking
(6) resist development
(7) rinsing As the integrated circuit technology is tending toward size reduction and higher integration, the lithographic technique has to transfer very fine patterns to resists. There is a desire to have a lithographic technique for transferring fine patterns to resists in good rectangularity and precise size. Also, since the number of layers in integrated circuits is increasing, a focus margin allowing for precise patterning even at large steps is required.

Among the recently developed techniques is to provide a contrast enhancing film on a photoresist film which is known as contrast enhancement lithography (CEL). As disclosed in EP 361627A and 355934A and U.S. Pat. No. 4,702,996, the contrast enhancing film is formed of a composition comprising a photo-fading compound such as arylnitrone compound and a polymer binder.

Contrast enhancing films are conventionally formed by dissolving photo-fading compounds in solvents and applying the resulting contrast enhancing compositions on photoresist films to form even films as by spin coating. Most conventional solvents in which the photo fading compounds are dissolved can attack the photoresist to a more or less extent. Then the contrast enhancing film and the photoresist film give rise to intermixing at their interface, adversely affecting the profile of the photo resist after development. It is thus not recommended to form the contrast enhancing film directly on the resist by spin coating. A water-soluble barrier film of polyvinyl alcohol or the like must be formed between the resist film and the contrast enhancing film.

The resist pre-baking and post-exposure baking steps are also essential in the CEL process. If the conventional contrast enhancing film is subject to the pre-baking and post-exposure baking steps with the barrier film intervening between the resist film and the contrast enhancing film, the contrast enhancing film can bleed into the resist film through the barrier film to intermix with the resist film, adversely affecting the profile of the photo-resist after development. It is then necessary to remove the barrier film and the contrast enhancing film prior to the post-exposure baking step.

Therefore, the conventional CEL process includes the following steps.

Process 2
(1) HMDS primer treatment of silicon water
(2) resist coating
(3) pre-baking
(4) coating of barrier and contrast enhancing films
(5) exposure
(6) removal of barrier and contrast enhancing films
(7) post-exposure baking
(8) resist development
(9) rinsing The process involving removal of the barrier and contrast enhancing films prior to post-exposure baking, however, requires to add to the production line of the above-mentioned Process 1 spin cups for spin coating the barrier and contrast enhancing compositions and process cups for receiving the removed barrier and contrast enhancing films, resulting in an increased installation cost of the production line and a reduced throughput.

SUMMARY OF THE INVENTION

Therefore, an object of the present invention is to provide a novel and improved process for forming a resist pattern having a profile as rectangular as possible, an increased focus margin, and improved resolution at steps. Another object of the present invention is to provide such a resist pattern forming process which can utilize the conventional installation without modification, simplifies the conventional process and is thus cost effective.

The process for forming a resist pattern on a substrate according to the present invention includes the steps of forming a water insoluble resist film on the substrate, forming a contrast enhancing film on the resist film from a contrast enhancing composition, pre baking the resist film before or after formation of the contrast enhancing film, exposing the resist film and the contrast enhancing film to light, baking the films after exposure, removing the contrast enhancing film after the baking step, and developing the resist film. The feature of the present invention resides in the contrast enhancing composition comprising an arylnitrone compound of the following general formula (1):

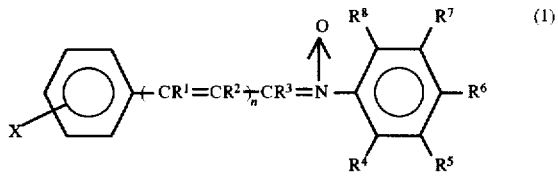

wherein $R^1$, $R^2$, and $R^3$ are independently an alkyl radical, an aryl radical or a hydrogen atom. $R^4$ to $R^8$ are independently an alkyl radical, a hydrogen atom or a carboxyl radical, at least one of $R^4$ to $R^8$ being a carboxyl radical. X is a hydrogen atom, an alkoxy radical represented by $R^9O$—, or a dialkylamino radical represented by $R^{10}R^{11}N$— wherein $R^9$ is an alkyl radical, $R^{10}$ and $R^{11}$ are independently an alkyl radical, and letter n has a value of 0, 1 or 2.

Since the arylnitrone compound of formula (1) is soluble in an alkaline aqueous solution, a contrast enhancing composition comprising the specific arylnitrone compound can be directly spin coated on the resist film to form a contrast enhancing film without a need for an intervening barrier film. No intermixing phenomenon occurs between the resist and contact enhancing films even when pre-baking and post-exposure baking are carried out with the contrast enhancing film overlying the resist film. This contrast enhancing film exerts superior contrast enhancement effect and forms a difficultly soluble layer on the resist film surface, which minimizes a thinning of the resist film in unexposed regions, providing a more rectangular profile. The contrast enhancement effect coupled with the difficultly soluble surface provides a further increased focus margin and an improved resolution. The present process performs resist coating and contrast enhancing composition coating with a single spin cup and removal of the contrast enhancing film and resist development with a single process cup without a need for an additional cup to the existing manufacture line. Since the existing line for photoresist can be used without modification, the present invention simplifies the process and reduces the cost.

DETAILED DESCRIPTION OF THE INVENTION

The process for forming a resist pattern on a substrate according to the present invention includes the step of forming a water insoluble resist film on the substrate, the step of forming a contrast enhancing film on the resist film from a contrast enhancing composition comprising an arylnitrone compound of formula (1), the pre-baking step of pre-baking the resist film before or after formation of the contrast enhancing film, the exposure step of exposing the resist film and the contrast enhancing film to light, the post-exposure baking (PEB) step of baking the films after exposure, the removal step of removing the contrast enhancing film after the baking step, and the development step of developing the resist film. The inventive process is characterized in that a contrast enhancing film is formed directly on the resist film after coating of the resist composition without interposing a barrier film, and that the PEB step is followed by removal of the contrast enhancing film and resist development.

Typically the resist pattern forming process of the present invention is used for forming resist patterns on silicon wafers though not limited to such applications.

Where the present process is applied to a silicon wafer, the wafer may be subject to conventional pre-treatment such as HMDS primer treatment.

According to the present process, a resist composition is applied to a substrate, typically a silicon wafer by suitable coating means such as spin coating. Any of well-known resist compositions may be used as long as they can form water-insoluble resist films. Preferred are positive resist compositions comprising a cresol novolak resin and a naphthoquinone diazidosulfonyl ester compound. The resist film may have any desired thickness although it is generally about 0.6 to 20 μm thick.

A contrast enhancing film is then formed on the resist film. To this end, the present invention uses a contrast enhancing composition comprising an arylnitrone compound of the following general formula (1), which is soluble in alkaline aqueous solution. This feature is successful in simplifying the conventional process.

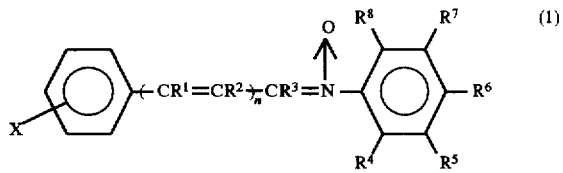

In formula (1), each of $R^1$, $R^2$, and $R^3$, which may be identical or different, is an alkyl radical, an aryl radical or a hydrogen atom. Exemplary alkyl radicals are those having 1 to 8 carbon atoms, such as methyl, ethyl, propyl, isopropyl, butyl, sec-butyl, tert-butyl and cyclohexyl radicals, with the methyl, ethyl, propyl, and butyl radicals being preferred. Exemplary aryl radicals are those having 6 to 15 carbon atoms, such as phenyl, substituted phenyl, naphthyl and substituted naphthyl radicals, with the phenyl, methylphenyl and ethylphenyl radicals being preferred.

Each of $R^4$, $R^5$, $R^6$, $R^7$, and $R^8$, which may be identical or different, is an alkyl radical, a hydrogen atom or a carboxyl radical, at least one of $R^4$ to $R^8$ being a carboxyl radical. Exemplary alkyl radicals are as mentioned for $R^1$, $R^2$, and $R^3$.

X is a hydrogen atom, an alkoxy radical represented by $R^9O$—, or a dialkylamino radical represented by $R^{10}R^{11}N$—. $R^9$ is an alkyl radical, $R^{10}$ and $R^{11}$, which may be identical or different, are alkyl radicals. Exemplary alkyl radical are as mentioned for $R^1$, $R^2$, and $R^3$.

Letter n has a value of 0, 1 or 2, preferably a value of 0 or 1.

The contrast enhancing composition used herein preferably consists essentially of 1 to 30% by weight, especially 1 to 15% by weight of the arylnitrone compound of formula (1) and the balance of water. For improving spin coating ability, there is optionally added about 0.5 to 30% by weight, preferably about 1 to 10% by weight of a water-soluble polymer having an average degree of polymerization of about 2,000 to about 12,000 such as polyvinyl alcohol, polyacrylic acid, polymethacrylic acid, polyvinyl pyrrolidone, polyethylene oxide, amylose, dextran, cellulose and pluran.

If the arylnitrone compound soluble in alkaline aqueous solution is less soluble in water, it is acceptable to add about 0.5 to 30% by weight, especially about 1 to 10% by weight of an organic base such as tris(hydroxymethyl)

aminomethane, pyridine, triethylamine, tetramethylammonium hydroxide solution, tetrabutylammonium hydroxide solution, and 2,2',2"-nitroethanol and about 0.0001 to 50% by weight, especially about 0.03 to 1% by weight of a surface active agent as long as the benefits of the present invention are not lost.

The contrast enhancing composition can be applied by any suitable means such as spin coating. The contrast enhancing film may have any desired thickness and is generally about 0.1 to 1 μm thick.

Since the contrast enhancing composition is soluble in an alkaline aqueous solution, coating of the resist composition on a substrate, typically silicon wafer can be directly followed by coating of the contrast enhancing composition by spin coating without a need for a barrier film. Then the films are pre-baked in a conventional manner. Alternatively, the resist film can be pre-baked prior to coating of the contrast enhancing composition. Pre baking may be done under suitable conditions, often at about 70° to 110° C. for about 40 to 120 seconds.

Next exposure is done in a conventional manner. Since the contrast enhancing film is formed, a more rectangular profile can be defined in the resist film. Exposure conditions may be determined in accordance with the type and thickness of the resist film and the like.

The assembly is then post-exposure baked while retaining the contrast enhancing film. Then the photosensitive agent is removed without intermixing between the contrast enhancing film and the resist film, and waving caused by standing waves is minimized. Post-exposure baking may be done under suitable conditions, often at about 80° to 130° C. for about 40 to 120 seconds.

Thereafter, the contrast enhancing film is washed away with pure water, for example, and the resist film is subsequently developed with a developer. Alternatively, an alkaline developer such as tetramethylammonium hydroxide, tetraethylammonium hydroxide, NaOH, KOH, chroline hydroxide and the like is used in an amount of 0.1 to 5% by weight to perform removal of the contrast enhancing film and development at the same time. Finally the assembly is rinsed with pure water, obtaining the desired resist pattern.

EXAMPLE

Examples of the present invention are given below by way of illustration and not by way of limitation. Unless otherwise stated, all parts and percents are by weight.

Example 1

A contrast enhancing composition was prepared by thoroughly dissolving 4.5 parts of an arylnitron of the following formula (2), 2.0 parts of tris(hydroxymethyl)aminomethane of the chemical formula: $(HOCH_2)_3CNH_2$, and 3.5 parts of a copolymer of 60% polyvinyl pyrrolidone and 40% polyacrylic acid (trade name Luviskol VA-64) in 90 parts of pure water.

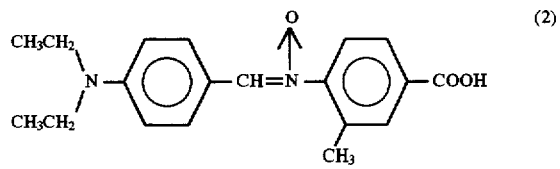
(2)

On a 6-inch silicon wafer, a photoresist (THMRip1800 manufactured by Tokyo Oka Kogyo K.K.) was spin coated first at 300 rpm for 3 seconds and then at 3,000 rpm for 30 seconds. Next the contrast enhancing composition was spin coated first at 300 rpm for 3 seconds and then at 4,000 rpm for 30 seconds. The coated wafer was pre-baked at a temperature of 90° C. for 90 seconds, forming a resist film of 1.26 μm thick and a contrast enhancing film of 0.18 μm thick.

Using an i-line stepper, the assembly was exposed to a pattern having a line-to-space distance of 0.36 μm. The wafer was post-exposure baked at a temperature of 110° C. for 90 seconds. The contrast enhancing film was then removed by rotating the wafer at 1,000 rpm and injecting pure water for 20 seconds. This was followed by static puddle development with a developer NMD-W (manufactured by Tokyo Oka Kogyo K.K.) at 23° C. for 65 seconds and rinsing with pure water.

Example 2

On a 6-inch silicon wafer, a photoresist (THMRip1800 manufactured by Tokyo Oka Kogyo K.K.) was spin coated first at 300 rpm for 3 seconds and then at 3,000 rpm for 30 seconds. The coated wafer was pre-baked at a temperature of 90° C. for 90 seconds, forming a resist film of 1.26 μm thick. Next the contrast enhancing composition of Example 1 was spin coated first at 300 rpm for 3 seconds and then at 4,000 rpm for 30 seconds, forming a contrast enhancing film of 0.18 μm thick.

Using an i-line stepper, the films were exposed to a pattern having a line-to-space distance of 0.36 μm. The wafer was post-exposure baked at a temperature of 110° C. for 90 seconds. The contrast enhancing film was then removed by rotating the wafer at 1,000 rpm and injecting pure water for 20 seconds. This was followed by static puddle development with a developer NMD-W (manufactured by Tokyo Oka Kogyo K.K.) at 23° C. for 65 seconds and rinsing with pure water.

Comparative Example 1

On a 6-inch silicon wafer, a photoresist (THMRip1800 manufactured by Tokyo Oka Kogyo K.K.) was spin coated first at 300 rpm for 3 seconds and then at 3,000 rpm for 30 seconds. The coated wafer was pre-baked at a temperature of 90° C. for 90 seconds, forming a resist film of 1.26 μm thick.

Using an i-line stepper, the resist film was exposed to a pattern having a line-to space distance of 0.36 μm. The resist film was post-exposure baked at a temperature of 110° C. for 90 seconds, subject to static puddle development with a developer NMD-W (manufactured by Tokyo Oka Kogyo K.K.) at 23° C. for 65 seconds, and then rinsed with pure water.

Comparative Example 2

On a 6-inch silicon wafer, a photoresist (THMRip1800 manufactured by Tokyo Oka Kogyo K.K.) was spin coated first at 300 rpm for 3 seconds and then at 3,000 rpm for 30 seconds. The coated wafer was pre-baked at a temperature of 90° C. for 90 seconds, forming a resist film of 1.26 μm thick. Next the contrast enhancing composition of Example 1 was spin coated first at 300 rpm for 3 seconds and then at 4,000 rpm for 30 seconds, forming a contrast enhancing film of 0.18 μm thick.

Using an i-line stepper, the films were exposed to a pattern having a line-to-space distance of 0.36 μm. The contrast enhancing film was removed by rotating the wafer at 1,000 rpm and injecting pure water for 20 seconds. This was followed by post-exposure baking at a temperature of 110°

C. for 90 seconds, static puddle development with a developer NMD-W (manufactured by Tokyo Oka Kogyo K.K.) at 23° C. for 65 seconds, and rinsing with pure water.

The resist patterns obtained in these Examples and Comparative Examples were observed for cross-sectional profile.

The profiles of the resist films according to the inventive process maintained sufficient rectangularity within the range of +0.6 μm and −0.2 μm from the focus point. In contrast, the resist of Comparative Example 1 where the contrast enhancing film was omitted had a profile which was rounded rather than rectangular. In Comparative Example 2 where the contrast enhancing film was stripped before post-exposure baking, the profile of the resist was not rectangular as in Examples 1 and 2 and maintained rectangularity only within the range of +0.2 μm and −0.2 μm from the focus point. All these results are shown in Table 1.

TABLE 1

| Focus position | Example 1 | Example 2 | Comparative Example 1 | Comparative Example 2 |
| --- | --- | --- | --- | --- |
| +0.8 μm | thinned | thinned | — | — |
| +0.6 μm | rectangular | rectangular | — | — |
| +0.4 μm | rectangular | rectangular | — | thinned |
| +0.2 μm | rectangular | rectangular | thinned | rectangular |
| 0 | rectangular | rectangular | rectangular | rectangular |
| −0.2 μm | rectangular | rectangular | rectangular | rectangular |
| −0.4 μm | thickened | thickened | thickened | thickened | thinned: The resist film was thinned.
thickened: The resist film was thickened at the substrate side.

Example 3

A resist pattern was formed as in Example 1 using an arylnitron of the following formula (3). It had a profile of the same quality as in Example 1.

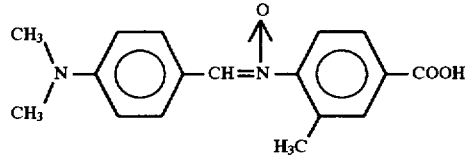

Example 4

A resist pattern was formed as in Example 1 using an arylnitron of the following formula (4). It had a profile of the same quality as in Example 1.

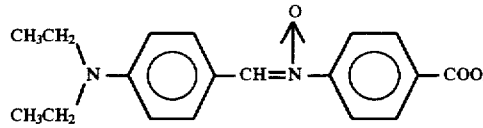

There has been described a process for forming a resist pattern having a fully rectangular profile and an improved focus margin. The process utilizes the conventional apparatus without substantial modification and offers an economic advantage.

Although some preferred embodiments have been described, many modifications and variations may be made thereto in the light of the above teachings. It is therefore to be understood that within the scope of the appended claims, the invention may be practiced otherwise than as specifically described.

We claim:

1. A process for forming a resist pattern on a substrate, comprising the steps of forming a water-insoluble resist film on the substrate, forming a contrast enhancing film on the resist film from a contrast enhancing composition, pre-baking the resist film before or after formation of said contrast enhancing film, exposing said resist film and said contrast enhancing film to light, baking the films after exposure, removing said contrast enhancing film after the baking step, and developing said resist film, said contrast enhancing composition comprising an arylnitrone compound of the following general formula (1):

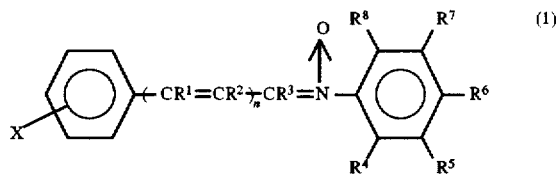

wherein $R^1$, $R^2$, and $R^3$ are independently an alkyl radical, an aryl radical or a hydrogen atom, $R^4$ to $R^8$ are independently an alkyl radical, a hydrogen atom or a carboxyl radical, at least one of $R^4$ to $R^8$ being a carboxy radical, X is a dialkylamino radical represented by $R^{10}R^{11}N-$ wherein $R^{10}$ and $R^{11}$ are independently an alkyl radical, and letter n has a value of 0, 1 or 2.

2. A method as in claim 1, wherein the substrate is a silicon wafer.

3. A method as in claim 2, wherein said silicon wafer is pretreated with a primer.

4. A method as in claim 1, wherein the alkyl radicals for $R^1$, $R^2$, and $R^3$ are selected from the group consisting of methyl, ethyl, propyl, isopropyl, butyl, sec.-butyl, tert.-butyl, and cyclohexyl, and the aryl radicals are selected from the group consisting of phenyl, substituted phenyl, naphthyl, and substituted naphthyl.

5. A method as in claim 1, wherein the alkyl radicals for $R^4$, $R^5$, $R^6$, $R^7$, and $R^8$ are selected from the group consisting of methyl, ethyl, propyl, isopropyl, butyl, sec.-butyl, tert.-butyl, and cyclohexyl.

6. A method as in claim 1, wherein $R^{10}$, and $R^{11}$ are alkyl radicals selected from the group consisting of methyl, ethyl, propyl, isopropyl, butyl, sec.-butyl, tert.-butyl, and cyclohexyl.

7. A method as in claim 1, wherein the contrast-enhancing composition consists essentially of 1–30% by weight of an arylnitrone compound of formula (1) and water.

8. A method as in claim 1, wherein the contrast-enhancing composition additionally contains 0.5–30% by weight of a water-soluble polymer having an average degree of polymerization of about 2000–12,000, and said polymer is selected from the group consisting of polyvinyl alcohol, polyacrylic acid, poly(meth)acrylic acid, polyvinyl pyrrolidone, polyethylene oxide, amylose, dextran, cellulose, and pluran.

9. A method as in claim 1, wherein the contrast-enhancing composition additionally contains 0.5–30% by weight of an organic base selected from the group consisting of tris (hydroxymethyl)-aminomethane, pyridine, triethylamine, tetramethylammonium hydroxide solution, tetrabutylammonium hydroxide solution, and 2,2',2"-nitroethanol.

10. A method as in claim 1, wherein the contrast-enhancing film formed has a thickness of from 0.1–1 μm.

11. A method as in claim 1, wherein the step of baking the films after exposure is performed at a temperature of from 80°–100° C. for about 40–120 seconds.

12. A method as in claim 1, wherein the contrast-enhancing film is removed with water after the baking step.

13. A method as in claim 1, wherein the contrast-enhancing film is removed with an alkaline developer.

14. A method as in claim 13, wherein the alkaline developer is selected from the group consisting of tetramethylammonium hydroxide, tetraethylammonium hydroxide, NaOH, KOH, chroline hydroxide.

15. A method as in claim 14, wherein the amount of alkaline developer is from 0.1–5% by weight to perform removal of the contrast-enhancing film and development of the resist film at the same time.

16. A method as in claim 15, wherein the assembly is rinsed with water following treatment with alkaline developer.

17. A method as in claim 1, wherein the contrast enhancing composition comprises an arylnitrone compound of general formula (1) wherein X is a dialkylamino radical represented by $R^{10}R^{11}N-$ and wherein $R^{10}$ and $R^{11}$ are independently an alkyl radical.

* * * * *